US008928336B2

(12) United States Patent
Salter et al.

(10) Patent No.: US 8,928,336 B2
(45) Date of Patent: Jan. 6, 2015

(54) PROXIMITY SWITCH HAVING SENSITIVITY CONTROL AND METHOD THEREFOR

(75) Inventors: Stuart C. Salter, White Lake, MI (US); Cornel Lewis Gardner, Romulus, MI (US); Jeffrey Singer, Canton, MI (US); Michael James Whitens, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 638 days.

(21) Appl. No.: 13/157,012

(22) Filed: Jun. 9, 2011

(65) Prior Publication Data

US 2012/0313648 A1    Dec. 13, 2012

(51) Int. Cl.
*G01R 27/04* (2006.01)
*H03K 17/955* (2006.01)

(52) U.S. Cl.
CPC .... *H03K 17/955* (2013.01); *H03K 2217/94026* (2013.01); *H03K 2217/960705* (2013.01)
USPC ........................................................ 324/647

(58) Field of Classification Search
USPC ......... 324/647, 600, 682–688, 548, 661, 200, 324/207.13, 219–246
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |
| 3,691,396 A | 9/1972 | Hinrichs | |
| 3,707,671 A | 12/1972 | Morrow et al. | |
| 3,826,979 A | 7/1974 | Steinmann | |
| 4,204,204 A | 5/1980 | Pitstick | |
| 4,205,325 A | 5/1980 | Haygood et al. | |
| 4,232,289 A | 11/1980 | Daniel | |
| 4,257,117 A | 3/1981 | Besson | |
| 4,290,052 A | 9/1981 | Eichelberger et al. | |
| 4,340,813 A | 7/1982 | Sauer | |
| 4,374,381 A | 2/1983 | Ng et al. | |

(Continued)

FOREIGN PATENT DOCUMENTS

DE   4024052    1/1992
EP   1152443    11/2001

(Continued)

OTHER PUBLICATIONS

"Touch Sensors Design Guide" by ATMEL, 10620 D-AT42-04/09, Revised Apr. 2009, 72 pages, Copyrighted 2008-2009 Atmel Corporation.

(Continued)

*Primary Examiner* — Melissa Koval
*Assistant Examiner* — Trung Nguyen
(74) *Attorney, Agent, or Firm* — Vichit Chea; Price Heneveld LLP (57) ABSTRACT

A vehicle proximity switch and method are provided having sensitivity control based on a user selected sensitivity input. The switch includes a proximity sensor such, as a capacitive sensor, installed in a vehicle and providing a sense activation field. The proximity switch also includes control circuitry for processing the sense activation field to sense user activation of the switch by comparing the sense activation field to a threshold. The proximity switch further includes a user sensitivity input for receiving a user selected sensitivity input. The control circuitry controls sensitivity of the comparison based on the user selected sensitivity input.

16 Claims, 5 Drawing Sheets

(56) References Cited

U.S. PATENT DOCUMENTS

| | | |
|---|---|---|
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A * | 2/1990 | Penner .................. 341/20 |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |

(56) References Cited

U.S. PATENT DOCUMENTS

| | | |
|---|---|---|
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 * | 8/2007 | Schmidt et al. ............... 362/501 |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,454,181 B2 | 6/2013 | Salter et al. |
| 8,508,487 B2 | 8/2013 | Schwesig et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0122554 A1 | 7/2003 | Karray et al. |
| 2004/0056753 A1 | 3/2004 | Chiang et al. |
| 2004/0145613 A1 | 7/2004 | Stavely et al. |
| 2004/0160072 A1 | 8/2004 | Carter et al. |
| 2004/0160234 A1 * | 8/2004 | Denen et al. .................. 324/679 |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0052429 A1 | 3/2005 | Philipp |
| 2005/0068712 A1 * | 3/2005 | Schulz et al. ................. 361/287 |
| 2005/0088417 A1 | 4/2005 | Mulligan |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0082545 A1 | 4/2006 | Choquet et al. |
| 2006/0244733 A1 | 11/2006 | Geaghan |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0309616 A1 | 12/2009 | Klinghult et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |

(56) References Cited

U.S. PATENT DOCUMENTS

| | | |
|---|---|---|
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0214253 A1 | 8/2010 | Wu et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082316 A1 | 4/2011 | Grafmans et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043976 A1 | 2/2012 | Bokma et al. |
| 2012/0049870 A1 | 3/2012 | Salter et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |

FOREIGN PATENT DOCUMENTS

| | | |
|---|---|---|
| EP | 1327860 | 11/2001 |
| EP | 1562293 | 11/2001 |
| EP | 2133777 | 10/2011 |
| EP | 2133777 B1 | 10/2011 |
| GB | 2071338 | 9/1981 |
| GB | 2158737 | 11/1985 |
| GB | 2279750 A1 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11313553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 A2 | 2/2007 |
| JP | 2008033701 A | 2/2008 |
| JP | 2010139362 A | 6/2010 |
| JP | 2010165618 A | 7/2010 |
| JP | 2012218422 | 9/2010 |
| JP | 2010239587 | 10/2010 |
| JP | 2010287148 A | 12/2010 |
| JP | 2011014280 A | 8/2011 |
| KR | 20040110463 | 12/2004 |
| KR | 20090127544 | 12/2009 |
| KR | 20100114768 | 10/2010 |
| WO | 9636960 | 11/1996 |
| WO | 9963394 | 12/1999 |
| WO | 2006093398 | 9/2006 |
| WO | 2007022027 | 7/2007 |
| WO | 2008121760 | 10/2008 |
| WO | 2009054592 A1 | 4/2009 |
| WO | 201011362 A1 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

JVC KD-AVX777 Detachable Front-Panel with Integrated 5.4"

(56) References Cited

OTHER PUBLICATIONS

Touch-Screen Monitor, 6 pages, www.crutchfield.com, no date provided.

NXP Capacitive Sensors, 1 page, www.nxp.com, copyrighted 2006-2010, NXP Semiconductors.

Densitron Displays, Introduction to Touch Solutions, White Paper, Revision 1.0 A, 14 pages, Aug. 21, 2007.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

Ergonomic Palm Buttons, Pepperl+Fuchs, www.wolfautomation.com, 6 pages, no date provided.

U.S. Appl. No. 13/489,731, filed Jun. 6, 2012, 30 pages and related filing receipt (3 pages).

Van Ess, Dave et al., "Capacitive Touch Switches for Automotive Applications," 7 pages, Published in Automotive DesignLine, www.automotiedesignline.com, Feb. 2006.

"CLEVIOS P Formulation Guide," 12 pages, www.clevios.com, Heraeus Clevios GmbH, no date provided.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

"Orgacon EL-P3000, Screen printing Ink Series 3000," 2 pages, AGFA, last updated in Feb. 2006.

"Moisture Immunity in QuickSense Studio," AN552, Rev. 0.1 Oct. 2010, 8 pages, Silicon Laboratories, Inc., © 2010.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

* cited by examiner

PROXIMITY SWITCH HAVING SENSITIVITY CONTROL AND METHOD THEREFOR

FIELD OF THE INVENTION

The present invention generally relates to switches, and more particularly relates to proximity switches with enhanced sensitivity control.

BACKGROUND OF THE INVENTION

Automotive vehicles are typically equipped with various user actuated switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch typically caused by a user's finger in close proximity or contact with the sensor. Proximity switches are typically configured to detect user actuation of the switch based on comparison of the sense activation field to a threshold. Unfortunately, different users often have different size fingers, different length finger nails, different actuation techniques, and may wear gloves exhibiting different dielectric properties, all of which may affect the results of the comparison of the actuation field to the threshold value which may result in different actuation detection levels. It is desirable to provide for an enhanced proximity switch that allows for such variations in use.

SUMMARY OF THE INVENTION

According to one aspect of the present invention, a proximity switch having sensitivity control is provided. The proximity switch includes a proximity sensor providing a sense activation field. The proximity switch also includes control circuitry for processing the sense activation field to sense user activation of the switch by comparing the sense activation field to a threshold. The proximity switch further includes a user sensitivity input for receiving a user selected sensitivity input. The control circuitry controls sensitivity of the comparison based on the user selected sensitivity input.

According to another aspect of the present invention, a vehicle capacitive switch having sensitivity control is provided. The capacitive switch has a capacitive sensor installed in a vehicle and providing a sense activation field. The capacitive switch also has control circuitry for processing the sense activation field to sense user activation of the switch by comparing the sense activation field to a threshold. The capacitive switch further includes a user sensitivity input for receiving a user selected sensitivity input. The control circuitry controls sensitivity of the comparison based on the user selected sensitivity input.

According to a further aspect of the present invention, a method of sensing user proximity with adjustable sensitivity control is provided. The method includes the steps of providing a sense activation field with a proximity sensor. The method also includes the step of processing the sense activation field to sense user activation of the proximity sensor by comparing the sense activation field to a threshold. The method further includes the steps of detecting a user sensitivity input and adjusting sensitivity of the comparison based on the user sensitivity input.

These and other aspects, objects, and features of the present invention will be understood and appreciated by those skilled in the art upon studying the following specification, claims, and appended drawings.

DETAILED DESCRIPTION OF PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
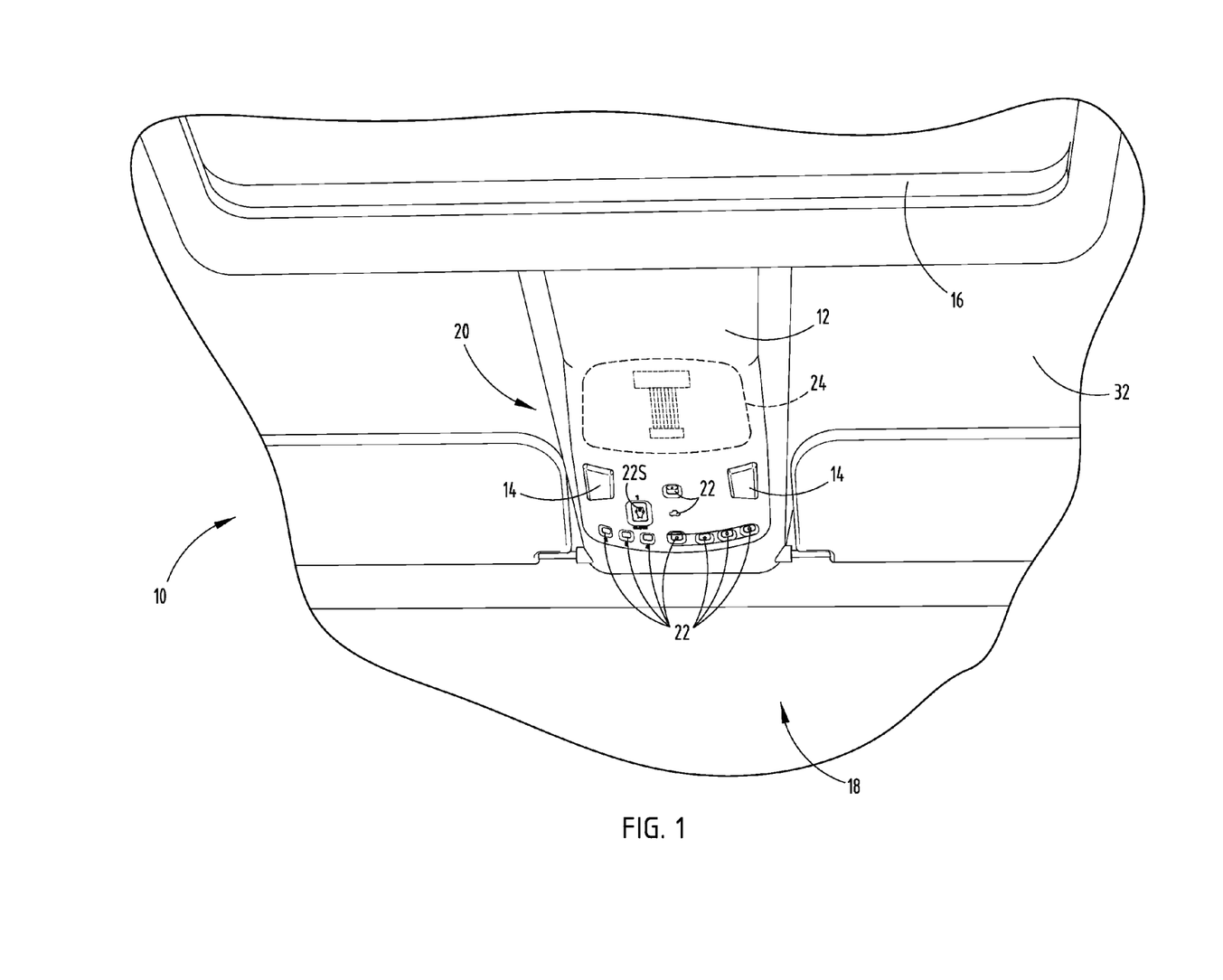
FIG. 1 is a perspective view of a passenger compartment of an automotive vehicle having an overhead console employing proximity switches having sensitivity control, according to one embodiment.
Figure 2:
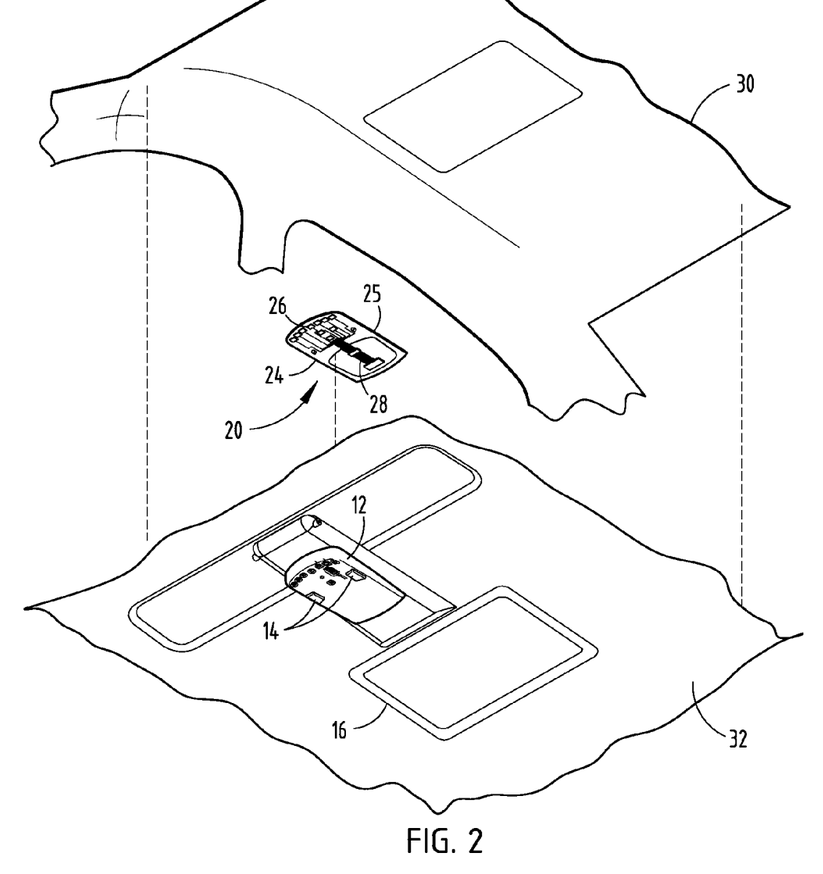
FIG. 2 is an exploded view of the overhead console within the headliner further illustrating the proximity switches shown in FIG. 1.

Referring to FIGS. 1 and 2, the interior of an automotive vehicle 10 is generally illustrated having a passenger compartment 18 and a switch assembly 20 employing a plurality of proximity switches 22 having user input sensitivity control, according to one embodiment. The vehicle 10 generally includes an overhead console 12 assembled to the headliner 32 on the underside of the roof or ceiling at the top of the passenger compartment 18, generally above the front passenger seating area. The switch assembly 20 having proximity switches 22 with sensitivity control is provided in the overhead console 12, according to one embodiment. The various proximity switches 22 may control any of a number of vehicle devices and functions, such as controlling movement of a sunroof or moonroof 16, activation of one or more lighting devices such as interior map/reading and dome lights 14, and various other devices and functions. However, it should be appreciated that the proximity switches 22 and sensitivity control user input may be located elsewhere on the vehicle 10, such as in the dash panel, on other consoles such as a center console, integrated into a touch screen display for a radio or infotainment system such as navigation and audio display, or located elsewhere onboard the vehicle 10.

The proximity switches 22 are shown and described herein as capacitive switches, according to one embodiment. Each proximity switch 22 includes at least one proximity sensor that provides a sense activation field to sense contact or close proximity of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIG. 1 each provide control of a vehicle component or device or provide a designated control function. One or more of the proximity switches 22 may be dedicated to controlling movement of a sunroof or moonroof 16 so as to cause the moonroof to move in an open or closed direction, tilt the moonroof, or stop movement of the moonroof based upon a control algorithm. Other proximity switches 22 may be dedicated to control other devices, such as turning an interior map/reading light on, turning a map/reading light off, turning a dome lamp on or off, unlocking a trunk, opening a rear hatch, or for defeating a door light switch. Additional controls via the proximity switches may include actuating door power windows up and down. Various other vehicle controls may be controlled by way of the proximity switches 22 described herein.

Additionally, a sensitivity sensor input 22S is provided to allow a user to select the sensitivity of the various proximity switches 22. In one embodiment, the sensitivity sensor input 22S is a capacitive sensor implemented as a proximity switch, such as a capacitive switch according to one embodiment, which allows a user to selectively switch to a desired sensitivity for the plurality of proximity switches 22. By actuating the sensitivity sensor input 22S as described herein, the sensitivity of each of the various proximity switches 22 are sequentially changed amongst low, medium and high sensitivity settings, according to one embodiment. Thus, users wearing gloves on their hands and fingers may change the sensitivity of the proximity switches 22 so as to increase the sensitivity to accommodate the use of the glove on the hand and finger or decrease the sensitivity when no glove is present. A user may also use the sensitivity control to change the sensitivity to accommodate differences among the users' fingers, finger nail sizes, and swipe techniques such as distance from the finger to the proximity switch 22 during a swiping input motion. The electrical conductivity of users' fingers may vary among users which results in different changes or disturbances to the sense activation field. The user sensitivity control advantageously allows a user to adjust for these variations in use.

In the capacitive sensor embodiment, the proximity switches 22 and sensitivity sensor input 22S each include capacitive plates or electrode pads which are formed as part of the capacitor and electronic circuitry 24. Electrical signals are applied to each of the capacitive switches 22 and the sensitivity sensor input 22S. According to one embodiment, the electronic circuitry 24 provides electrical signals having a burst length to charge the capacitive sensors. The charge burst length determines the base amplitude of the sense activation field and the sensitivity of the corresponding proximity switches 22. By changing the charge burst length of the applied electrical signal, the sensitivity of each proximity switch 22 can be changed, according to one embodiment. According to another embodiment, the comparison threshold value can be changed to change the sensitivity of each of the proximity switches 22.

The switch assembly 20 has the capacitor and electronic circuitry 24 as shown in FIG. 2 which includes capacitive plates/pads 26 and lead lines 28 formed onto a circuit board 25. The circuit board 25 is assembled into the overhead console 12. The overhead console 12 is sandwiched between the roof 30 and the headliner 32 such that the overhead console 12 extends from the headliner 32.

Figure 3:
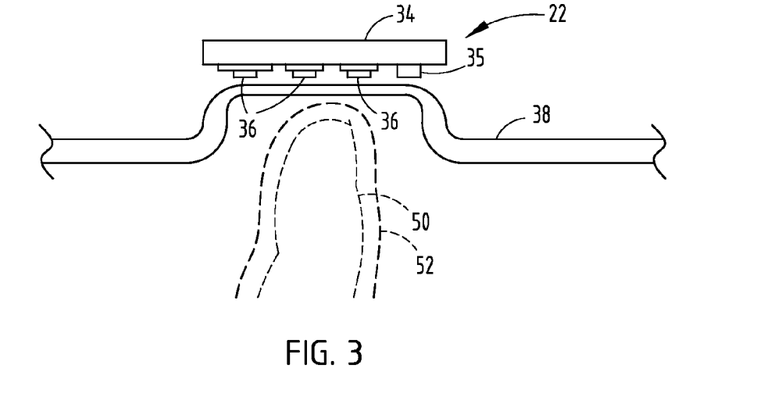
FIG. 3 is a cross-sectional view taken through lines III-III of FIG. 1 further illustrating a proximity sensor such as the sensitivity sensor input, in relation to a gloved finger.
Figure 4:
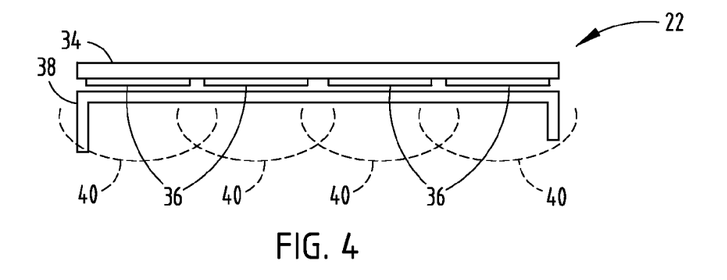
FIG. 4 is a cross-sectional view taken through a proximity sensor having multiple overlapping sense activation fields, according to one embodiment.
Figure 5:
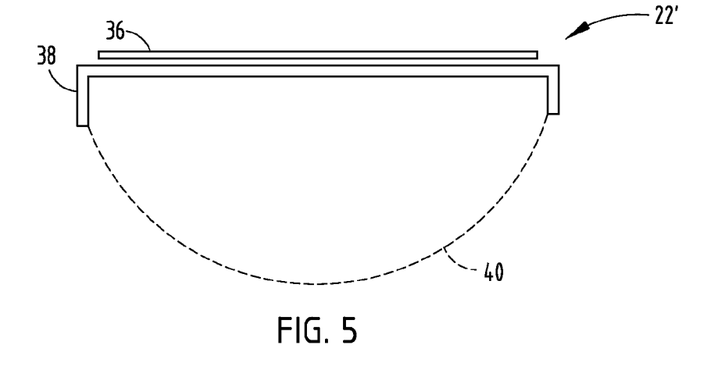
FIG. 5 is a cross-sectional view taken through a proximity sensor having a single sense activation field, according to another embodiment.

Examples of capacitive proximity switch sensors are illustrated in FIGS. 3-5. In FIG. 3, a finger 50 of a user wearing a glove 52 is illustrated actuating a proximity switch 22 with the gloved finger, according to one embodiment. Actuation of the proximity switch 22 may be achieved by a swiping motion of the user's finger which may contact an outer surface of the sensor housing or may be sufficiently close to the switch 22 such that the finger passes through the sense activation field. In one embodiment, activation of any of the proximity switches 22 can cause a device to perform a designated function. For example, activation of a proximity switch can cause the moonroof to move in an open or closed direction, or stop movement of the moonroof based upon a control routine. According to another embodiment, each of a plurality of sensors or arrays of sensors may be activated to provide individual control functions such that one array of sensors may open the moonroof, another array of sensors may close the moonroof, and a further array of sensors may tilt the moonroof. In addition, the proximity switches may include one or more light sources 35 that backlight the circuit board 34 or emit light between the circuit board 34 and the console surface, such that the emitted light is viewed through the console surface of the switch.

The proximity switch 22 shown in FIG. 4 has a circuit board substrate 34 and a plurality of sensors 36 that generate an activation field. In this embodiment, a plurality of overlapping sense activation fields 40 is generated by a plurality of capacitive sensors 36. It should be appreciated that the overall activation field 40 may have a rectangular shape formed by the individual arch-shaped fields 40.

According to another embodiment, a single capacitive sensor arrangement 36 may be employed to create a single activation field 40 as shown in FIG. 5. The single activation field may have a generally arch-shaped field in a generally rectangular or circular area. It should be appreciated that any number of capacitive sensors forming any number of activation fields may be employed to sense activation of the proximity switch 22.

Figure 6:
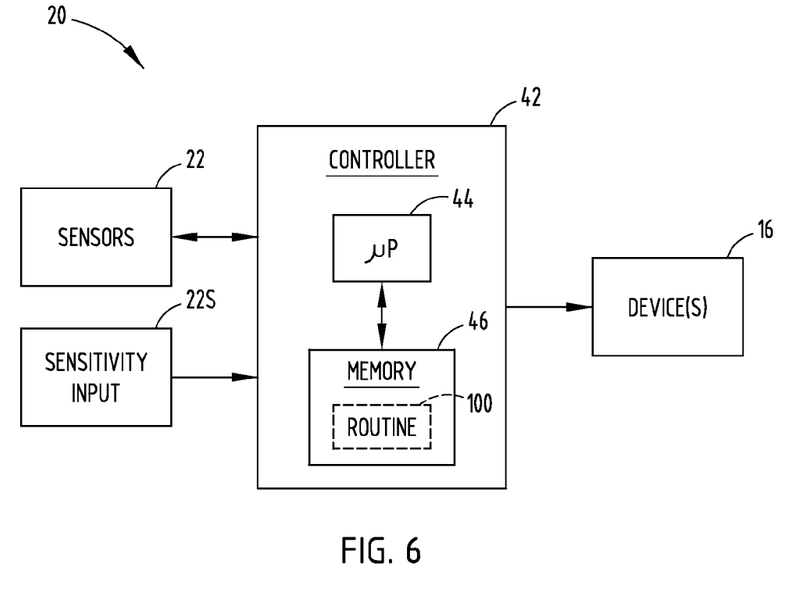
FIG. 6 is a block diagram illustrating a proximity switch having sensitivity control, according to one embodiment.

Referring to FIG. 6, the proximity switch assembly 20 is illustrated according to one embodiment. One or more of proximity switches 22 are shown providing inputs to a controller 42. Additionally, the sensitivity sensor input 22S provides an input to the controller 42. The controller 42 may include control circuitry, such as a microprocessor 44 and memory 46. It should be appreciated that other analog and/or digital control circuitry may be employed to provide sensitivity control adjustment. The controller 42 processes one or more routines 100 stored in memory 46 executable by the microprocessor 44 based upon the inputs of one or more of proximity switches 22 and sensitivity sensor input 22S. It should be appreciated that the controller 42 may adjust the sensitivity of the proximity switch 22 based upon a selected sensitivity sensor input 22S from a user. The sensitivity of each proximity switch 22 is then adjusted based on the user selected sensitivity and used to detect actuation by one or more users.

The controller 42 further provides control outputs to one or more devices 16 so as to control the devices based on user activation of one or more of the proximity switches 22. For example, the moonroof may be controlled to open or close based on activation of a switch 22. In doing so, the output may be generated when the sense activation field for the switch 22 exceeds a threshold value.

In the embodiment shown, a separate and distinct sensitivity sensor input 22S is shown and described herein for receiving a user input to change sensitivity of the proximity switches 22. The sensitivity input 22S may include a dedicated proximity switch, such as a capacitive switch, according to one embodiment. According to another embodiment, the sensitivity input may be a shared switch that performs one or more control functions and also receives a sensitivity input pursuant to a predetermined protocol. For example, a proximity switch 22 that performs a function, such as opening or closing a moonroof, may also serve as the sensitivity sensor input whereby a user provides one or more inputs pursuant to a technique such as tapping on the proximity switch 22 a predetermined number of times or holding a finger on the proximity switch 22 for a minimum time period to cause the switch 22 to enter a sensitivity input mode.

Figure 7:
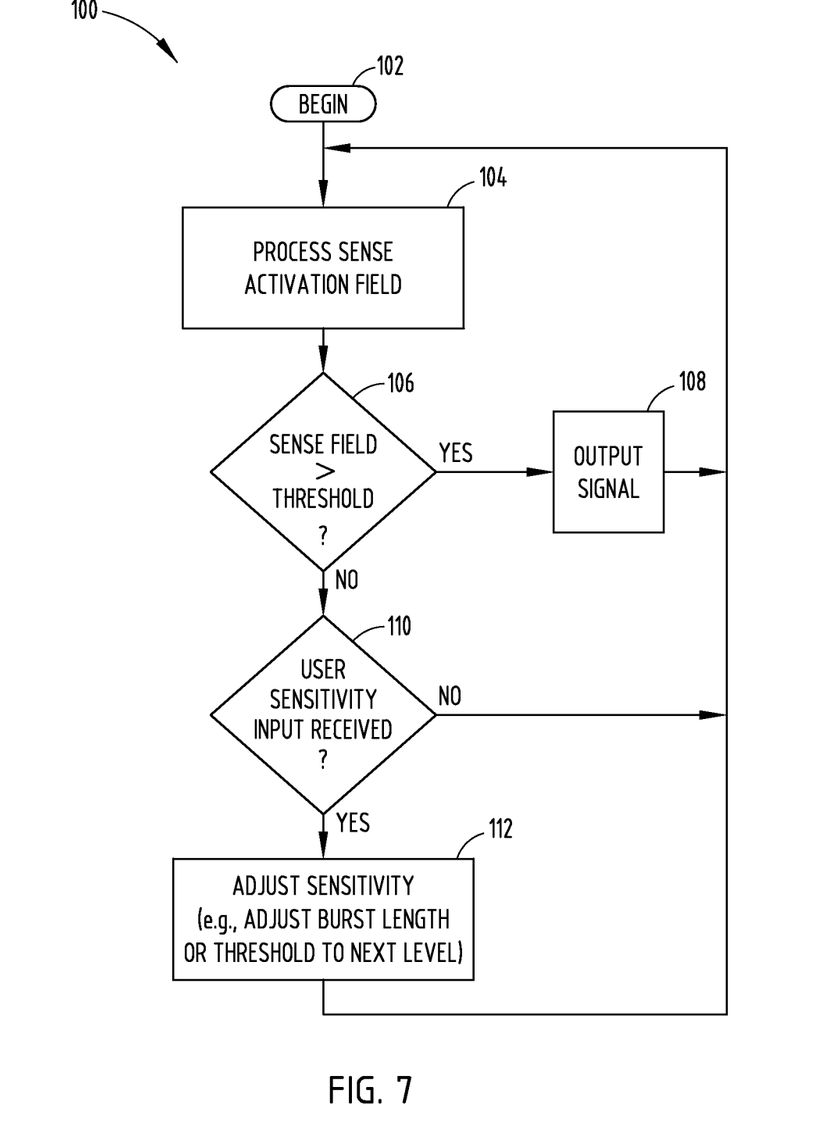
FIG. 7 is a flow diagram illustrating a routine for controlling sensitivity of proximity switches based on a user input, according to one embodiment.

Referring to FIG. 7, the sensitivity control routine 100 is illustrated for controlling sensitivity of the proximity switches based on user activation of the sensitivity sensor input 22S. Routine 100 begins at step 102 and proceeds to step 104 to process the sense activation field. Next, at decision block 106, routine 100 determines if the sense activation field exceeds a threshold and, if so, outputs a signal at step 108. If the sense activation field does not exceed the threshold, routine 100 proceeds to decision block 110 to determine if a user sensitivity sensor input has been received indicative of a user activating the sensitivity input to change the sensitivity of the proximity switches. If no sensitivity input is received, routine 100 returns to step 104 to continue processing the sense activation signal at the current sensitivity setting. If a user sensitivity input has been received, routine 100 proceeds to step 112 to adjust the sensitivity of the proximity switches pursuant to the selected sensitivity input. The adjustment of the sensitivity may include incremental changes in sensitivity among a select number of settings, such as three levels of sensitivity (e.g., low, medium and high) and sequentially incrementing through each level upon each successive actuation of the sensitivity sensor input 22S, according to one embodiment. It should be appreciated that sensitivity of the proximity switches may be adjusted based on any number of two or more settings, according to other embodiments. The sensitivity of the proximity switches 22 may be adjusted by changing the charge burst length of electrical signals applied to each of the proximity switches, according to one embodiment. According to another embodiment, the threshold value used in the comparison may be adjusted to change the sensitivity of the proximity switches 22.

Figure 8:
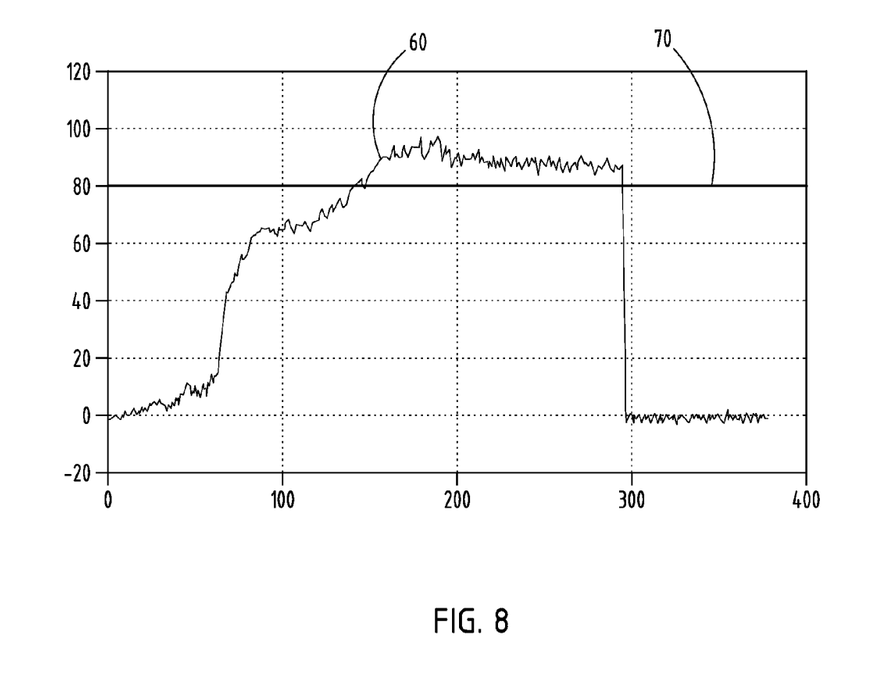
FIG. 8 is a graph illustrating comparison of the sensed activation field to an adjustable sensitivity threshold.

Referring to FIG. 8, a sensed activation field 60 is illustrated in comparison to a threshold value 70. When the sensed activation field 60 exceeds the threshold value 70, actuation of the proximity switch is detected. A user may change the sensitivity of the proximity switches so as to change the threshold value 70 to a lower threshold to increase the sensitivity or may increase the threshold value 70 to decrease the sensitivity, according to one embodiment. Alternately, the order of magnitude of the activation signal 60 may be changed to increase or decrease signal 60 by changing the charge burst length so as to adjust the sensitivity of the proximity switches.

Accordingly, the proximity switch arrangement advantageously provides for user adjustment of the sensitivity of proximity switches 22 provided onboard a vehicle 10. By adjusting the sensitivity of the proximity switches 22 via a user selected sensitivity input 22S, a user may change the sensitivity of the detection of an activating finger to accommodate for the user of a glove worn over the user's finger. Additionally, changes to sensitivity may accommodate other variations in the activation by a user, such as different length fingers, differing lengths of user fingernails which may cause the finger to be more distant from the sensor, or a particular swipe motion technique used by the user.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A proximity switch having sensitivity control comprising:
   a proximity sensor providing a sense activation field;
   control circuitry processing the sense activation field to sense user activation of the switch by comparing the sense activation field to a threshold; and
   a user sensitivity input for receiving a user selected sensitivity input, wherein the proximity sensor and the user sensitivity input each include capacitive plates or electrode pads which are formed as part of a capacitor and electronic circuitry, wherein electrical signals are applied to each of the proximity sensor and the user sensitivity input, and wherein the sensitivity of the proximity switch may be adjusted by changing a charge burst length of an electrical signal applied to the proximity sensor based on the user selected sensitivity input.

2. The proximity switch of claim 1, wherein the proximity switch is installed in a vehicle for use by a passenger in the vehicle.

3. The proximity switch of claim 1, wherein the proximity sensor comprises a capacitive sensor.

4. The proximity switch of claim 1, wherein the user sensitivity input comprises a capacitive switch.

5. The proximity switch of claim 1 further comprising an output for providing an output signal to control a device.

6. The proximity switch of claim 1, wherein the user sensitivity input comprises a dedicated user actuated switch.

7. The proximity switch of claim 1, wherein the user sensitivity input comprises one or more shared switches.

8. The proximity switch of claim 1, wherein the user sensitivity input is used to control sensitivity of a plurality of proximity switches.

9. A vehicle capacitive switch having sensitivity control comprising:
   a capacitive sensor installed in a vehicle and providing a sense activation field;
   control circuitry processing the sense activation field to sense user activation of the switch by comparing the sense activation field to a threshold; and
   a user sensitivity input for receiving a user selected sensitivity input, wherein the capacitive sensor and user sensitivity input each include capacitive plates or electrode pads which are formed as part of a capacitor and electronic circuitry, wherein electrical signals are applied to each of the proximity sensor and the user sensitivity input, and wherein the sensitivity of the capacitive sensor may be adjusted by changing a charge burst length of an electrical signal applied to the capacitive sensor based on the user selected sensitivity input.

10. The capacitive switch of claim 9 further comprising an output for providing an output signal to control a device.

11. A method of sensing user proximity with adjustable sensitivity control, said method comprising;

providing a sense activation field with a proximity sensor;

processing the sensed activation field to sense user activation of the proximity sensor by comparing the sensed activation field to a threshold;

detecting a user sensitivity input, wherein the proximity sensor and the user sensitivity input each include capacitive plates or electrode pads which are formed as part of the capacitor and electronic circuitry, and wherein electrical signals are applied to each of the proximity sensor and the user sensitivity input; and adjusting sensitivity of the comparison based on the user sensitivity input, whereon the sensitivity of the proximity sensor may be adjusted by changing a charge burst length of an electrical signal applied to the proximity sensor.

12. The method of claim 11, wherein the proximity sensor is installed in a vehicle for use by a passenger in the vehicle.

13. The method of claim 11, wherein the proximity sensor comprises a capacitive sensor.

14. The method of claim 11, wherein the step of detecting a user sensitivity input comprises sensing a user input with a dedicated sensitivity input.

15. The method of claim 11, wherein the step of detecting a user sensitivity input comprises sensing a user input with a shared input.

16. The method of claim 11 further comprising the step of outputting a control signal based on the comparison to control a device.

* * * * *